(12) United States Patent
Chuang

(10) Patent No.: US 10,511,320 B2
(45) Date of Patent: Dec. 17, 2019

(54) LOW DISTORTION SUCCESSIVE APPROXIMATION REGISTER (SAR) ANALOG-TO-DIGITAL CONVERTERS (ADCS) AND ASSOCIATED METHODS

(71) Applicant: Taiwan Semiconductor Manufacturing Company Limited, Hsinchu (TW)

(72) Inventor: Mei-Chen Chuang, Pingtung County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/139,146

(22) Filed: Sep. 24, 2018

(65) Prior Publication Data

US 2019/0097646 A1 Mar. 28, 2019

Related U.S. Application Data

(60) Provisional application No. 62/564,351, filed on Sep. 28, 2017.

(51) Int. Cl.
*H03M 1/12* (2006.01)
*H03M 1/46* (2006.01)
(Continued)

(52) U.S. Cl.
CPC .......... *H03M 1/468* (2013.01); *H03M 1/462* (2013.01); *G11C 27/02* (2013.01); *H03M 1/10* (2013.01); *H03M 1/12* (2013.01); *H03M 1/802* (2013.01)

(58) Field of Classification Search
CPC .......... H03M 1/802; H03M 1/12; H03M 1/10; G11C 27/02
(Continued)

(56) References Cited

U.S. PATENT DOCUMENTS 7,961,132 B1 * 6/2011 Perry .................. H03M 1/0607
341/155

* cited by examiner

*Primary Examiner* — Joseph J Lauture
(74) *Attorney, Agent, or Firm* — Jones Day

(57) ABSTRACT

An ADC device comprises a comparator having an output, a first input, and a second input. And the ADC includes a SAR configured to receive the output of the comparator as an input and to generate based thereon a parallel digital output having a most significant bit (MSB) and a plurality of less significant bits associated with a reference voltage. The ADC also includes a DAC configured to receive the parallel digital output from the SAR and to generate based thereon an internal analog signal, the internal analog signal applied as the first input to the comparator. The DAC further includes a capacitor network coupled to the first input having a redistribution capacitor coupled to a first voltage that is greater than the reference voltage such that a ratio N is equal to the reference voltage divided by the first voltage. The DAC also includes one or more first capacitors also coupled to the first voltage, where at least one first capacitor is associated with the MSB. The DAC further including and a plurality of second capacitors coupled to the reference voltage, wherein the redistribution capacitor having a capacitive value that is equal to (1–N) times the total capacitance of a parallel combination of the one or more first capacitors. And the second capacitors are associated with less significant bits, and an input voltage line carrying an input voltage ($V_{IN}$) switchably coupled to the first input or switchably coupled to the second input.

20 Claims, 13 Drawing Sheets

(51) Int. Cl.
*H03M 1/80* (2006.01)
*G11C 27/02* (2006.01)
*H03M 1/10* (2006.01)

(58) Field of Classification Search
USPC .................................. 341/172, 155, 120, 122
See application file for complete search history.

LOW DISTORTION SUCCESSIVE APPROXIMATION REGISTER (SAR) ANALOG-TO-DIGITAL CONVERTERS (ADCS) AND ASSOCIATED METHODS

CROSS-REFERENCE TO RELATED APPLICATIONS

This application claims priority to U.S. Provisional Patent Application No. 62/564,351, filed Sep. 28, 2017 and entitled "Low Distortion ADC Techniques," the entire contents of which are incorporated by reference herein.

FIELD

The technology described in this disclosure relates generally to analog-to-digital converters (ADCs) and more particularly to successive approximation register (SAR) ADCs and associated methods.

BACKGROUND

A successive approximation register (SAR) analog-to-digital converter (ADC) converts a sampled analog voltage into a discrete digital representation by using a binary search through possible quantization levels before finally converging upon a digital output. The sampled voltage may be sampled from a continuous analog signal.

BRIEF DESCRIPTION OF THE DRAWINGS

Aspects of the present disclosure are best understood from the following detailed description when read with the accompanying figures. It is noted that, in accordance with the standard practice of the industry, various features are not drawn to scale. In fact, the dimensions of the various features may be arbitrarily increased or reduced for clarity of discussion.

DETAILED DESCRIPTION

Figure 1:
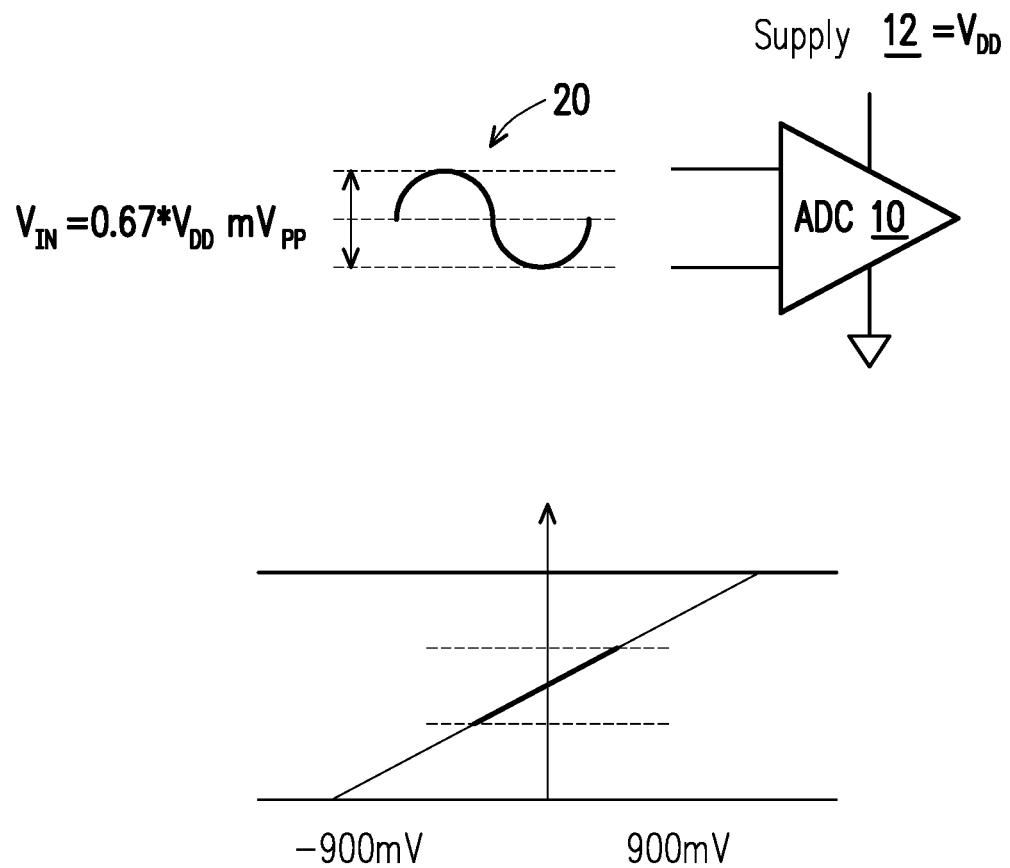
FIG. 1 depicts an example diagram illustrating voltages associated with inputs to an ADC in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The details of the methods and devices of the present disclosure are described in the attached disclosure and drawings. It should be noted that the present technology is not limited to ADCs, but also is applicable to other circuitry into which an SAR, S/H circuit, DACs, or other described circuitry suitably can be integrated.

The present disclosure relates to a low distortion analog-to-digital converter (ADC) that provides consistent performance when an analog input signal ($V_{IN}$) that is being converted to a digital approximation varies over a voltage ranges that is smaller than a reference signal voltage level. FIG. 1 illustrates a situation in which a $V_{IN}$ differential input signal 20 to be sampled has a maximum peak-to-peak voltage of $0.67V_{DD}$. For example, differential input signal 20 may be a sinusoid varying between $0.335V_{DD}$ and $-0.335V_{DD}$. Input signal 20 is sampled by an ADC 10. ADC 10 is supplied by an input voltage supply of $V_{DD}$ which is greater than the input signal 20 maximum peak to peak voltage. Supply voltage $V_{DD}$ is selected for logic speed concerns. As one will appreciate in high speed semiconductor device applications, logic speed of the SAR ADC is affected by rise times within logic circuits, and rise times are directly affected by supply current. A larger supply voltage applied to a given logic circuit line will experience a larger current leading to faster rise times.

When an expected range of a sampled signal, e.g. 20, is smaller than a supply voltage, e.g. 12, an external reference voltage is typically used when implementing an, e.g. SAR ADC 10. A reference voltage may selected based on maximum peak-to-peak voltage of an expected $V_{IN}$ 20, which may be a varying signal having a voltage that varies over a range that is smaller than a supply voltage. Following the example above, for example a reference signal $V_{ref}$ may be $0.375\ V_{DD}$, when a variable voltage $V_{IN}$ that varies over a range of voltages is to be converted to digital and has a maximum expected voltage of less than $0.375\ V_{DD}$ e.g. max. $V_{IN}=0.335\ V_{DD}$, where peak-to-peak voltage of VIN is $0.67V_{DD}$. Because, as it will be appreciated, an SAR ADC performs a binary search of values relative to a reference voltage, if the reference voltage is larger than an expected range of $V_{IN}$ then unnecessary time and resources are expended searching unnecessary values. Thus, having a $V_{REF}$ appropriately selected based on the maximum expected $V_{IN}$ optimizes performance of the SAR ADC.

In known implementations, SAR ADC, e.g. 10, may be supplied directly by $V_{REF}$, but performance may suffer as a result of a smaller supply voltage because rise times increase thereby reducing the speed of a device's logic circuits.

Alternatively, an external or internal Vref generator is relied upon. For example an SAR ADC, e.g. 10, may be supplied by VDD, and receive an external or internally $V_{REF}$ from a low drop out (LDO) voltage converter (not illustrated). This solution, however, impacts both area and power considerations as one will appreciate. Another known solution is to amplify input signal $V_{IN}$ to an amplified input signal proportional to $V_{DD}$, but this introduces potential for error arising from linearity concerns. Another known solution is to implement a resistor divider network to obtain $V_{REF}$, which is easier for design and routing but increases power consumption and speed concerns, because current and required decoupling capacitors for driving an ADC may be relatively larger.

Figure 2A:
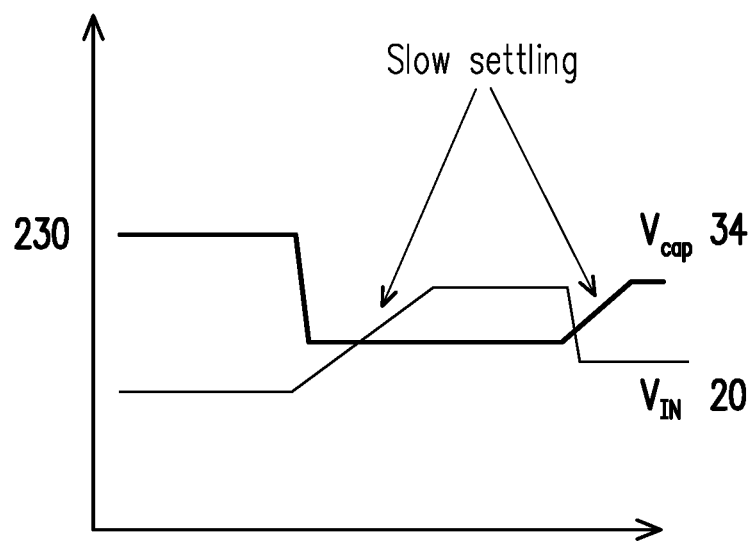
FIG. 2 illustrates settling speed of a large capacitor supplied by a relatively small voltage.
Figure 2B:
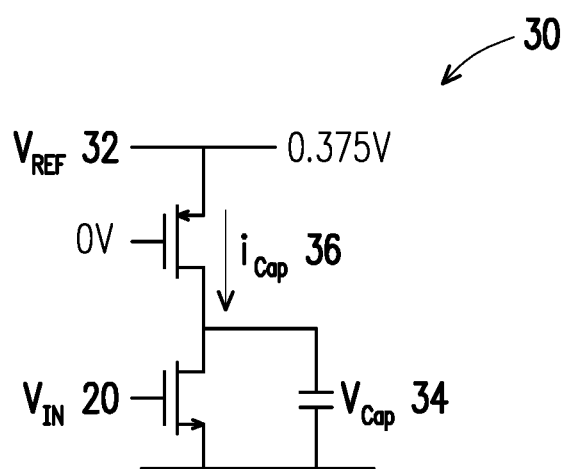

Also, FIGS. 2A and 2B illustrate speed concerns that arise in known methods using a simplified representational circuit 30. FIG. 2A illustrates how slow rise times lead to slow voltage settling, which can lead to incorrect decisions, when as illustrated in FIG. 2B, for example $V_{REF}$ of $0.375V_{DD}$ drives capacitors of an SAR ADC (illustrated as one capacitor, but may be many capacitors as one will appreciate). As $V_{IN}$ 20 falls, $V_{REF}$ provides charge to $V_{cap}$ 34 via current $i_{cap}$ 36 that is proportional to $V_{REF}$ 32. Thus, the rise time of $V_{cap}$ 34 responsive to $V_{IN}$ 20 is negatively impacted by a low $V_{REF}$ 32. This is because speed concerns arise when a driving voltage or current cannot fully develop during an SAR ADC conversion period (discussed further below).

The present methods and devices can overcome such performance degradation in an SAR ADC with an improvement in an SAR ADC's footprint. An improved SAR ADC is obtained by configuring a most-significant bit (MSB) capacitor of the internal DAC (i.e. the largest capacitor) to take input from $V_{DD}$ or other suitable voltage source(s), rather than from $V_{REF}$. As a result, the high speed semiconductor SAR ADC can operate at high speeds with relatively consistent performance in terms of speed. Furthermore, one or more more-significant bits can also take a supply voltage from $V_{DD}$ further increasing the speed in which voltages develop.

An SAR ADC in accordance with this disclosure, also simplifies Vref design, precluding the need for a LDO based implementation, and the capacitors driven by Vref may be made smaller, thereby increasing voltage settling speed on those capacitors. In an exemplary embodiment of an 8-bit 500 pF unit capacitor ADC design in accordance with this disclosure, for example, realizes a 500% increase in speed while requiring 25% of the area of known solutions and also substantially reduce the size of necessary decoupling capacitors.

Figure 3:
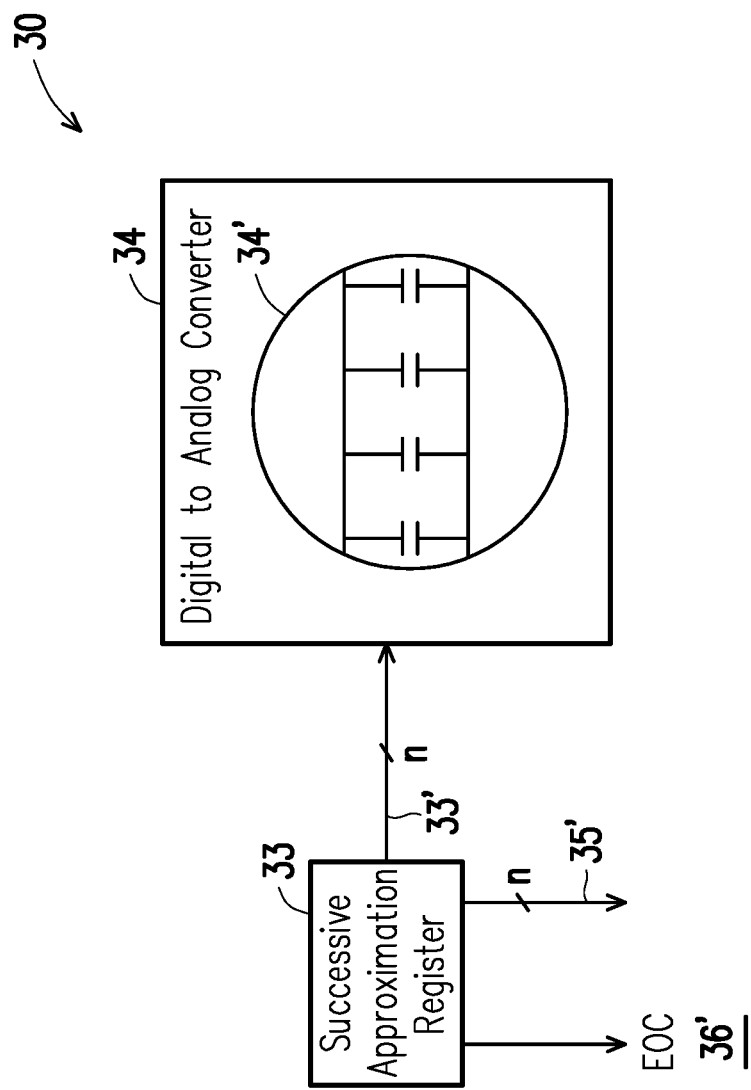
FIG. 3 depicts a block diagram of aspects of an SAR ADC.

For example, FIG. 3 depicts an example diagram of components of a successive approximation register (SAR) analog-to-digital converter (ADC) 30 in accordance with some embodiments. As illustrated in FIG. 3, an SAR ADC can include an SAR sub-circuit 33 configured to supply a parallel n-bit digital word 33' to an internal digital-to-analog converter (DAC) 34 that includes a capacitor bank 34' and switching components (not particularly illustrated here). The SAR 33 output 33' which is provided to DAC 34 can include a digital code or word that converges on an approximation of a sampled voltage sampled from analog input signal $V_{IN}$. The DAC 34 relies on a reference voltage to generate an internal analog voltage based on the output 33', and provides that internal analog voltage to a comparator in a manner such as described below with reference to FIGS. 4 and 5. A $V_{REF}$ is selected in view of the maximum voltage of an input signal $V_{IN}$.

As provided herein, in order to increase the performance of an SAR ADC 30, when the most significant bit (MSB) and/or one of the more significant bits of the SAR 33 input to the internal DAC 34 of the SAR ADC is set, one or more associated capacitors within capacitor bank 34' respectively can be driven by the supply voltage $V_{DD}$ or $V_{SS}$, or other suitable voltage(s), rather than by the reference voltage ($V_{REF}$) alone. By respectively driving these capacitors with $V_{DD}$ or $V_{SS}$ or other suitable voltage, the speed of the more significant bits can be faster, and the design of the $V_{REF}$ supply can be simplified. By "more significant bits" and "less significant bits" it is meant bits that are less significant than the MSB, and optionally can include the least significant bit (LSB). In examples that include both "more significant bits" and "less significant bits," the "more significant bits" can be more significant than the less significant bits, and the "less significant bits" can be less significant than the more significant bits. It should be appreciated that even in embodiments including a plurality of bits that are less significant than the MSB, such embodiments can be considered to include "more significant bits" but not "less significant bits" or to include "less significant bits" but not "more significant bits."

Figure 4:
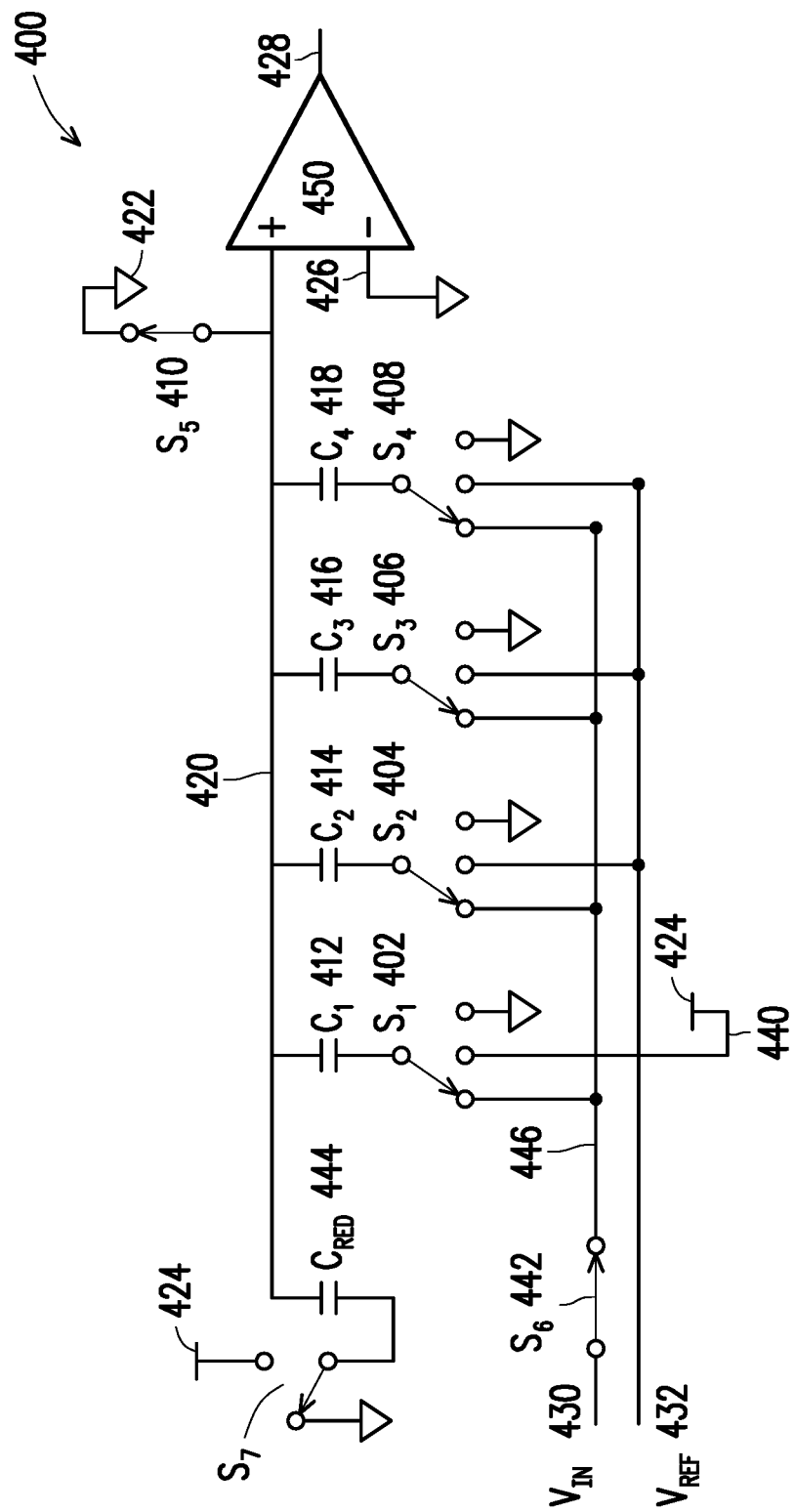
FIG. 4 depicts an example diagram of components of an SAR ADC in accordance with some embodiments.
Figure 5:
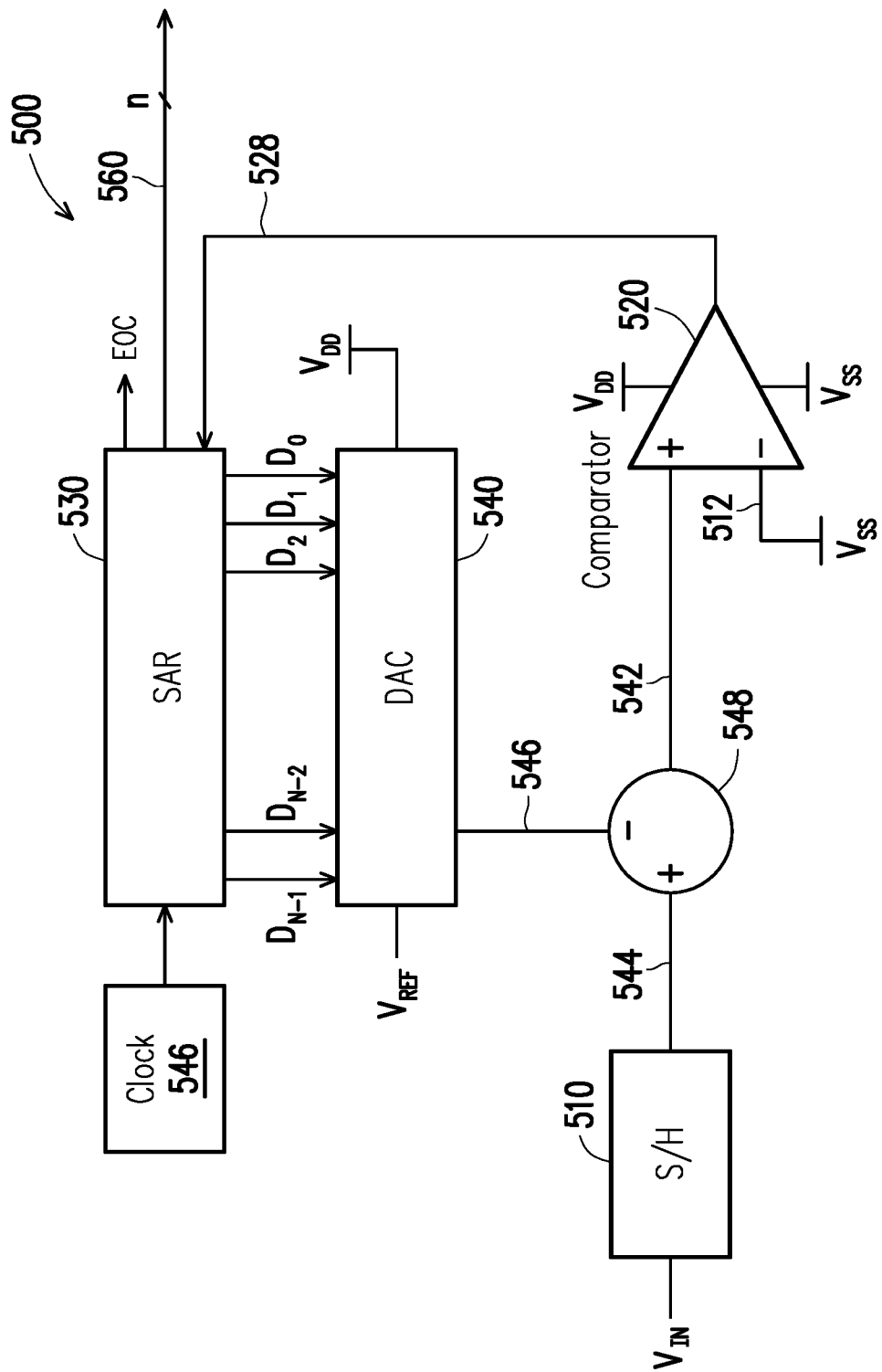
FIG. 5 depicts an example diagram of components of an SAR ADC in accordance with some embodiments.

Circuit 400 includes aspects of an exemplary 4-bit DAC that may be used in an SAR ADC (e.g. such as SAR ADC 500 illustrated in FIG. 5 discussed below) in accordance with this disclosure is illustrated in FIG. 4. The aspects of a 4-bit DAC illustrated in circuit 400 for example may correspond to aspects of DAC 500, where each switch $S_1$-$S_4$ 402, 404, 406, 408 is controlled by SAR 530 signals $D_{N-1}$, $D_{N-2}$, ... $D_0$ (these control signals not particularly illustrated in FIG. 4). Comparator 450 may correspond to comparator 520. Comparator output node 428 may correspond to comparator output node 528, node 426 may correspond to node 512 and node 420 may correspond to node 542. Switch $S_6$ 442 may correspond to sample and hold (S/H) circuit 510. Alternatively, in some embodiments, switch $S_6$ 442 may be a switch further in series with S/H circuit 510 between S/H circuit 510 and the SAR ADC, e.g. between S/H 510 and node 544, which may correspond to node 446 in FIG. 4. In FIG. 5, summer 548 is merely illustrative to show that during operation of SAR ADC 500 node 542 takes the difference between node 544 (an input voltage sampled from $V_{IN}$ and maintained by S/H 510) and node 546, an output from the DAC. It will be appreciated that in each case of FIG. 4 and FIG. 5 the illustrated embodiments are not intended to be limiting, and are instead intended as illustrative of one or more aspects of the present disclosure.

As shown circuit 400 includes a comparator 450 with an non-inverting input coupled to a first node 420 and an inverting input coupled to a second node 426. The first node 420 is coupled to capacitors $C_1$-$C_4$ (412, 414, 416, 418) and switch $S_5$ 410. $S_5$ 410 is coupled between node 420 and VSS 422. Comparator 450 also includes an inverting input coupled to node 426, which is also coupled to VSS 422. Comparator 450 also includes an output providing an output signal to output node 428, which is coupled to an SAR in a similar manner as output node 528 as shown in FIG. 5 (discussed below). It will be appreciated that the terminals of comparators 450 and 520 are illustrated for exemplary purposes, and that the coupling of nodes 420 and 426 or 512 and 542 to the respective inverting or non-inverting terminals may alternatively be coupled in the opposite manner, e.g. such that node 420 is coupled to the inverting terminal, and node 426 is coupled to the non-inverting terminal, thereby altering the polarity of the circuits output logic but otherwise operation of the circuit 400 would remain the same (additional logic in circuit 500, e.g. within SAR 530 would also need to reflect polarity of the logic).

Figure 7A:
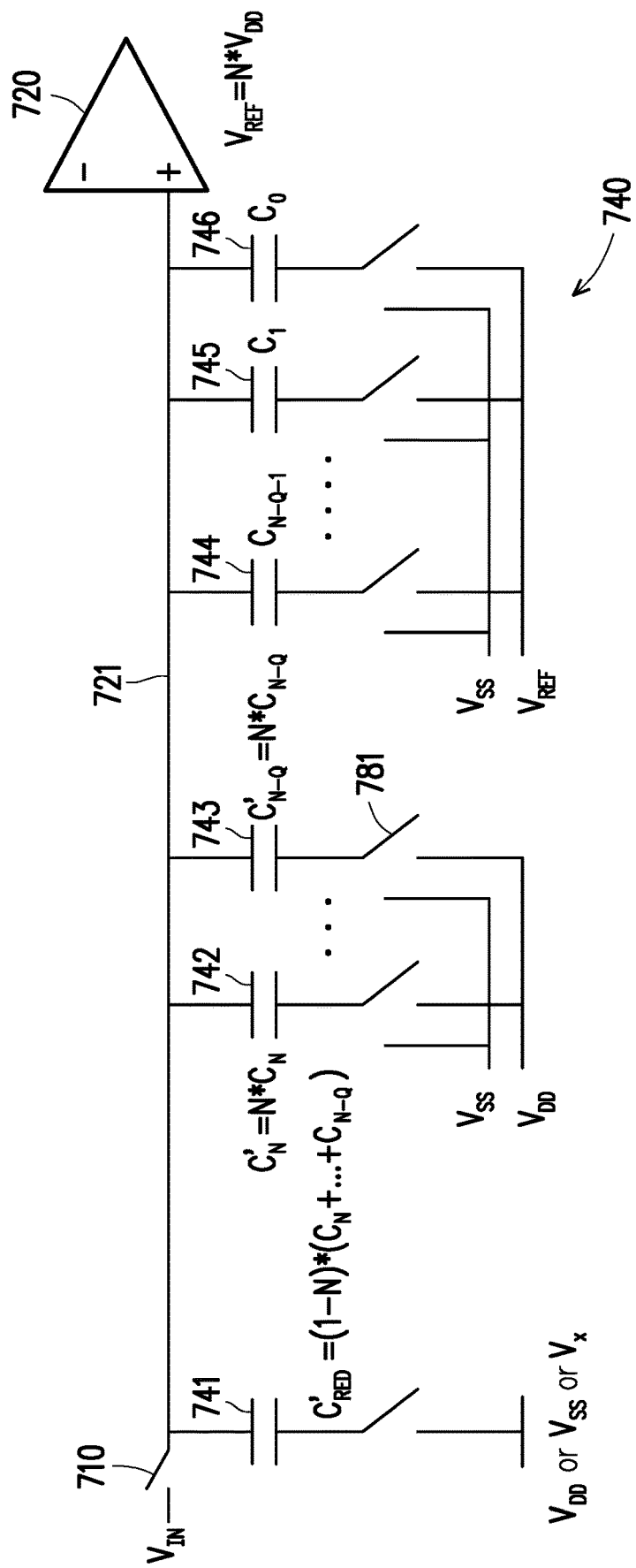
FIGS. 7A-7B depict example diagrams of circuit components of an SAR ADC in accordance with some embodiments.
Figure 7B:
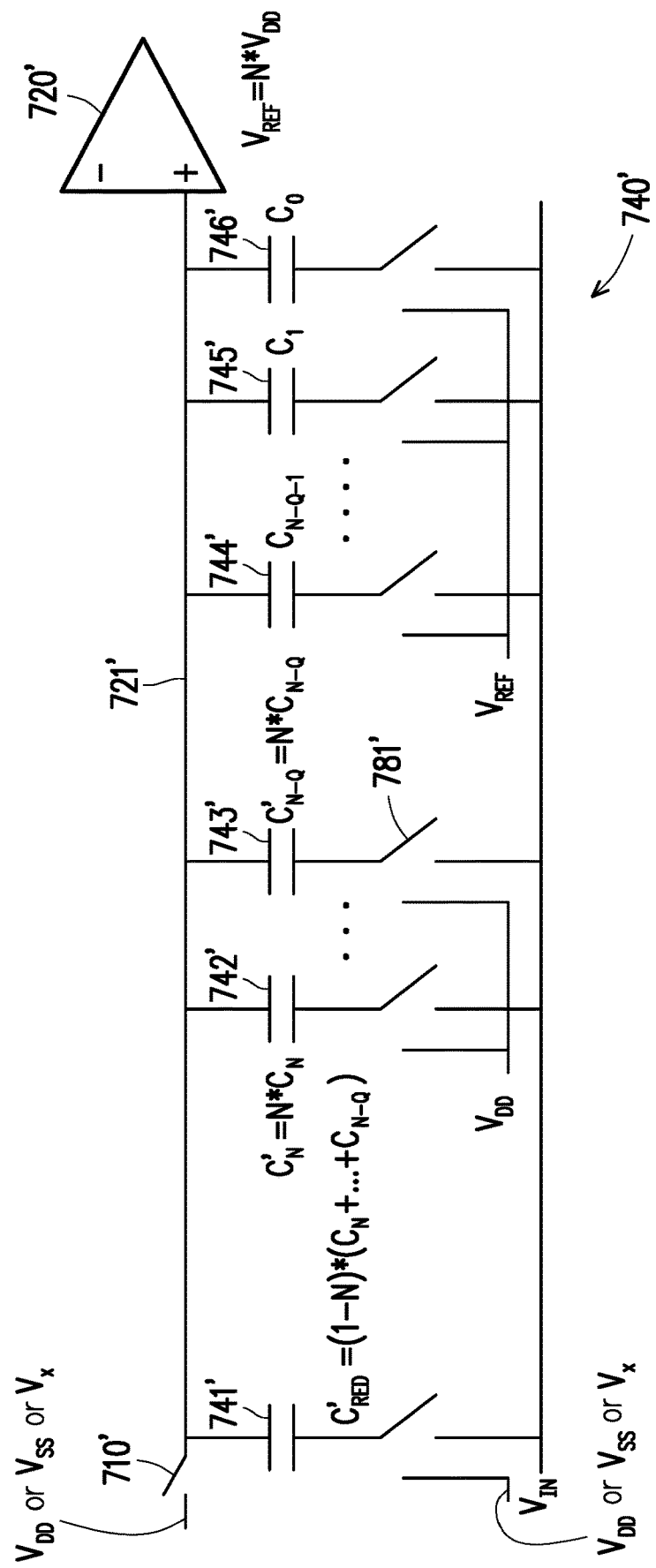
Figure 8:
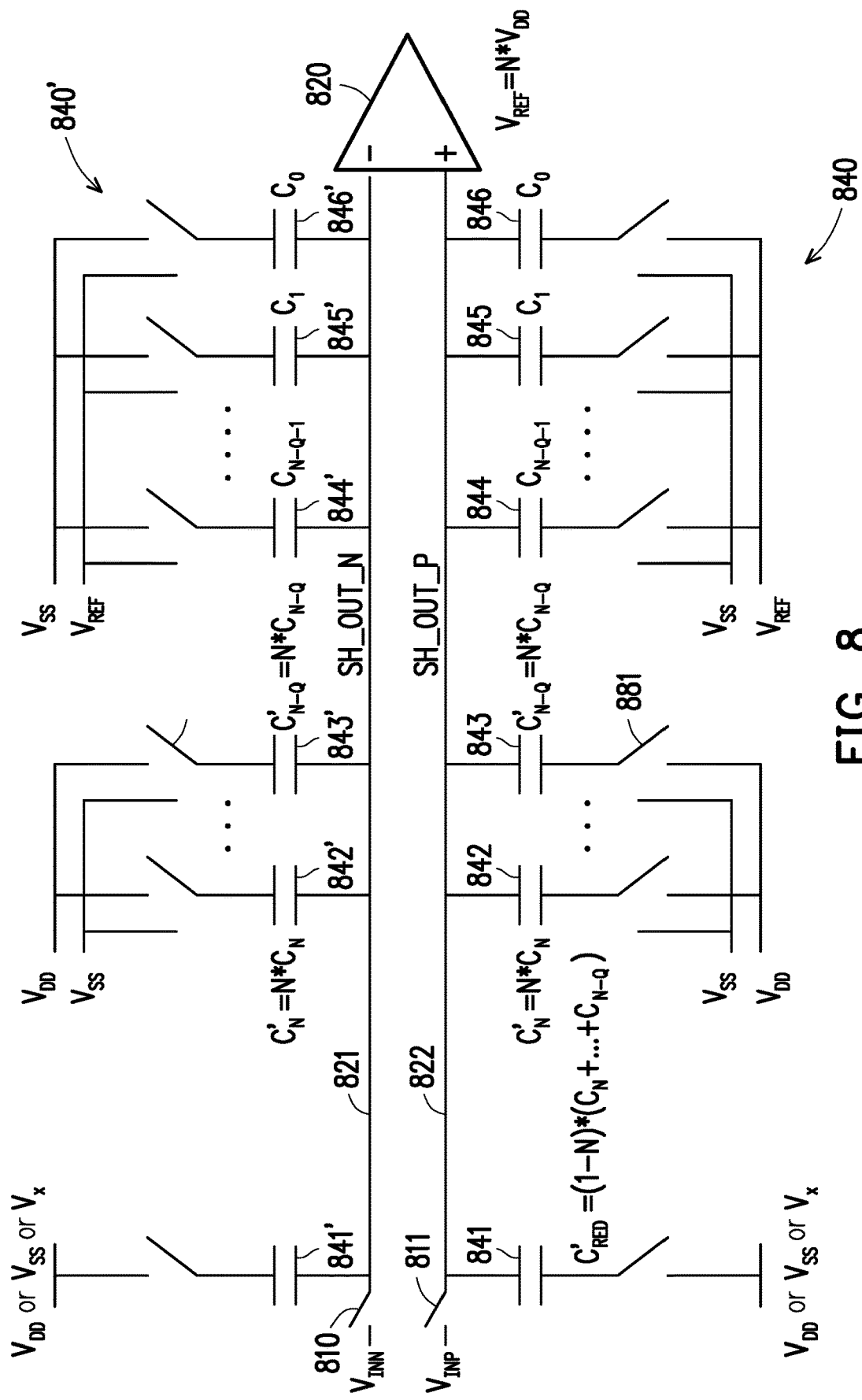
FIG. 8 depicts an example diagram of circuit components for use in a diffrenetial SAR ADC in accordance with some embodiments.

Each of capacitor $C_1$-$C_4$ is further coupled to $S_1$-$S_4$ (402, 404, 406, 408). In embodiments illustrated in FIG. 5, analogous capacitors to $C_1$-$C_4$ reside within DAC 540. It will be appreciated that this is but one implementation of an SAR ADC, and that there are many ways that a DAC may be implemented for the purposes of an SAR ADC in combination with a comparator. Here, in this example, the comparator is configured to compare a voltage on node 420 with VSS 422 on node 426. Other configurations may instead compare a DAC output on node 420 with, e.g. VIN, VSS, VDD, or other desired voltages. One will appreciate how various components of the DAC can be organized depending on how the comparison is made. The exemplary configuration shown here is referred to as a charge redistribution configuration. In the exemplary embodiment depicted in FIG. 4, comparison is made to VSS 422. In embodiments VSS 422 is ground, in other embodiments VSS 422 is any suitable voltage. For the purpose of this example, VSS 422 is ground. Capacitor $C_{RED}$ 444 is a redistribution capacitor selectably coupling node 420 to $V_{DD}$ 424 or $V_{SS}$ 422 through switch $S_7$. Alternative embodiments are illustrated in FIGS. 7A, 7B, and 8 (further described below). In some embodiments another suitable voltage $V_X$ may drive $C_{RED}$. A suitable voltage $V_X$ is any fixed stable voltage source and is not limited to VSS or VDD that is not affected during switching of the capacitors.

As explained in further detail below, in accordance with the present disclosure, an SAR ADC achieves a higher speed over known SAR ADCs while also enabling simpler design of a reference supply (e.g. for supplying $V_{REF}$ 432) by driving more significant bits, i.e. those associated with more significant bits and therefore larger capacitors as one will appreciate, with a supply voltage greater than a reference voltage.

In embodiments, in reference to FIG. 4 for ease of explanation, capacitor $C_1$, corresponding to a MSB, is driven with VDD 424 instead of $V_{REF}$ 432. Because VDD>$V_{REF}$, and VDD is capable of providing a larger current, driving $C_1$ with VDD allows a voltage to develop faster across $C_1$ than in known SAR ADCs that drive a MSB with a reference voltage that is less than VDD. To account for the increased driving voltage, which alters the voltage added to (or removed from) node 420 when switching $S_1$, the capacitance of capacitor $C_1$ is modified such that it differs from known methods by a factor of N=$V_{REF}$/VDD, and to account for the change in switched capacitor capacitance, the capacitance is added back into the circuit in the form of $C_{RED}$ 444 also driven by VDD. In some embodiments, as illustrated in FIGS. 7A, 7B, and 8, a MSB as well as other more significant bits are driven by VDD, in which case each capacitor driven by VDD is modified from known configurations by a factor N, and the total modified capacitance is added back into the circuit in the form of $C_{RED}$. For example, if a most significant bit, and two more significant bits have a total capacitance of 1 $C_U$ (where $C_U$ is a general unit of capacitance) then each is reduced by a factor of N, and such that the total modified capacitance is N*$C_U$, and $C_{RED}$=(1−N)*$C_U$. The remaining capacitors are driven by $V_{REF}$ just as in known SAR ADCs.

In the depicted exemplary embodiments, switches $S_1$-$S_7$ are set in what is referred to as track mode, such that $V_{IN}$ is constantly charging and discharging the parallel combination of capacitors. In embodiments illustrated in FIG. 5, analogous switches to $S_1$-$S_7$ reside within DAC 540, except switch $s_6$ 442 may be S/H 510. A hold mode is initiated by opening switch $S_6$, an input switch, thereby leaving the sampled analog voltage, sampled from $V_{IN}$, on the capacitor array (412, 414, 416, 418). Switch $S_5$ is then opened allowing the voltage at node 420 to move (or be redistributed) as each switch is manipulated by signals from an SAR, e.g. signals $D_{N-1}$–$D_0$ from SAR 540. Switches $S_1$-$S_4$ are known as bit switches as each is controlled by a single bit of an SAR n-bit digital word output (shown in FIG. 5 as $D_{N-1}$–$D_0$). Switch $S_1$ corresponds to the MSB of the SAR output, $S_4$ corresponds to the LSB, and $S_2$-$S_3$ correspond to more significant bits than $S_4$ and less significant bits than $S_1$.

To illustrate the techniques of the present disclosure, it is helpful to consider exemplary DAC 400 in view of known SAR ADC DAC implementations. In known SAR ADC DAC configurations (not illustrated) $C_{RED}$ would be omitted, and an exemplary configuration would include $C_1$=$C_U$, $C_2$=$C_U$/2, $C_3$=$C_U$/4, $C_4$=$C_U$/4, where $C_U$ is a unit capacitance and the total capacitance of the parallel combination of $C_1$-$C_4$ is 2$C_U$, and node 440 is also coupled to $V_{REF}$ 432 instead of to VDD 424 (i.e. supply) as in accordance with FIG. 4 of various embodiments of the present invention. Thus, in known DACs for an SAR ADC, when switches S1-S4 are coupled to VSS 422, e.g. ground, a voltage equal to −$V_{IN}$, i.e. having a magnitude of $V_{IN}$ (as $V_{IN}$ is sampled when switch S6 is opened, but for simplicity referred to here as simply $V_{IN}$) appears on node 420. When S1 coupled to $V_{REF}$, (e.g. by setting bit $D_{N-1}$ in SAR 530), by simple voltage division across $C_1$ a voltage equal to $V_{REF}$/2 (i.e. having a magnitude equal to $V_{REF}$/2 is added to −$V_{IN}$. The comparator then makes the MSB decision by comparison −$V_{in}$+$V_{REF}$/2 to VSS. Based on this comparison, a corresponding SAR, e.g. 530, either leaves S1 connected to $V_{REF}$, or connects it to ground depending on the comparator output (which, e.g., may be high or low depending on whether the voltage at node 420 is negative or positive). The SAR MSB is set accordingly (for example, the MSB=0 when comparator output is high, and MSB=1 when comparator output is low).

Continuing the example based on known SAR ADC's in the preceding paragraph above, the process is repeated for each switch S2-S4 as the SAR tests and sets or resets each bit (i.e. sets to 0 or 1). Thus, each bit of the SAR output adds a binary weighted voltage: S1 adds either 0 or $V_{REF}$/2; S2 adds either 0 or $V_{REF}$/4; S3 adds either 0 or $V_{REF}$/8; and S4 adds either 0 or $V_{REF}$/8. When this process completes, the SAR has either set or reset each bit, and the resulting 4-bit word is the digital approximation sampled VIN. This resulting 4-bit word is then output from SAR (not particularly illustrated in FIG. 4, but see n bit output 560 corresponding to DN−1, DN−2, . . . , D0), an EOC signal may also be asserted to announce to an external circuit that the convergence is complete and a valid digital word is available.

This known process described immediately above of resolving each bit of the SAR output by testing each bit through a DAC using a capacitor array is referred to as a binary search that performs a successive approximation algorithm. Implementing a successive approximation algorithm using a capacitor array in this way normally depends on the precise selection of capacitors, and successively tying each to the same $V_{REF}$. $V_{REF}$ is typically selected to be approximately the same magnitude as the largest expected sampled signal. Thus, e.g. if a sampled signal is never expected to exceed 1V, $V_{REF}$ may be 1 volt. Thus, upon sampling a varying $V_{IN}$ a first test of a MSB adding $V_{REF}$/2=0.5V to node 420 tests whether the sampled $V_{IN}$ is greater than a midpoint of possible expected values. If $V_{IN}$ is less than $V_{REF}$/2 the MSB is reset and the next bit is tested by tested by adding $V_{REF}$/4, or 0.25V, to node 420, thus totaling 0.25V on node 420—a midpoint between 0V and 0.5V. If during the MSB test, sampled VIN is greater than $V_{REF}/2$, the MSB remains set, and the test continues by adding $V_{REF}/4$, thereby again testing a midpoint, this time between VREF/2 and $V_{REF}$. This process is then repeated for each of n bits. Because a successive approximation register (SAR) individually compares an input voltage to the midpoint of one of n ranges to determine the value of each bit, one will appreciate that capacitor values are selected based on the overall circuit design and desired digital resolution of the SAR ADC (i.e. the number of bits of the digital approximation where more bits results in finer resolution). In the example above, total capacitance was 2CU, with a MSB capacitor equal to CU and binary weighted values corresponding to powers of two with a resolution of $V_{REF}/8$. One will appreciate that any suitable capacitor scheme may be implemented. In another example, a 12 bit SAR ADC has a LSB switched across a capacitor having capacitance $C_U$, and a MSB corresponding to $1024*C_U$ for a total capacitance of $2048C_U$. Thus, with the background of an exemplary SAR ADC operation as set forth above, aspects of the present disclosure are set forth as follows.

In accordance with some embodiments of the present invention, instead of coupling S1 to $V_{REF}$, S1 is coupled instead to VDD. This has the advantage of allowing the large capacitor C1 to be driven by VDD instead of the relatively smaller $V_{REF}$, increasing the speed at which voltages develop on node 420. In embodiments, other more significant bits may also be coupled to VDD, but as illustrated only C1 is coupled to VDD. By driving the MSB with VDD (and in embodiments more significant bits) C1 is driven by a greater current. This simplifies the design of a supply for $V_{REF}$ by reducing the amount of current that is required from $V_{REF}$ supply, and this also speeds up the speed at which MSB voltages develop. But the change in supply voltage to C1 from $V_{REF}$ to VDD requires that the capacitor sizes be modified to correct the equation performed by the successive approximation algorithm. That is instead of adding $V_{REF}/2$ to node 420, MSB capacitor C1 now adds VDD/2. Therefore, MSB caps are reduced accordingly, but to ensure the algorithm's equation remains correct, the MSB capacitance is added back through capacitor $C_{RED}$. Thus, when an MSB is driven by VDD (i.e. when MSB is set) $C_{RED}$ is selectably tied to VDD 424 through switch $S_7$, and in a sample configuration S7 is coupled to VSS 422. In other embodiments switch S7 may also selectably tie to VX, which is any suitable voltage as dictated by design considerations.

In the exemplary embodiment depicted, the MSB capacitor 412 size is reduced to account for the altered weights accorded to each bit switch $S_1$-$S_4$ (412, 414, 416, 418). For example, in the embodiment shown in FIG. 4, to add back the altered capacitance by modifying capacitor 412, e.g. $C_1 = C_U*N$, where $V_{REF} = N*VDD$, the value of $C_{RED}$ is $(1-N)C_1$. Thus, in accordance with this disclosure, exemplary capacitors of the embodiment shown in FIG. 4 $\{C_{RED}, C_1, C_2, C_3, C_4\}$ take the values $\{(1-N)C_U, N*C_U, C_U/2, C_U/4, C_U/4\}$.

In other embodiments, e.g. such as embodiments shown in FIGS. 7A, 7B, and 8, a MSB and one or more more-significant bits are driven by VDD, while the remaining take $V_{REF}$. Thus, assuming in the example above C1 and C2 are driven by VDD (as opposed to only C1), capacitors $\{C_{RED}, C_1, C_2, C_3, C_4\}$ take the values $\{(1-N)(C_U+C_U/2), N*C_U, N*C_U/2, C_U/4, C_U/4\}$.

In general, for any switched capacitor SAR ADC having capacitors $\{C_N, C_{N-1}, \ldots, C_{N-Q}, C_{N-Q-1}, \ldots, C_2, C_1, C_0\}$, where each capacitor having an index greater than N-Q is driven by VDD, and where $V_{REF}=N*VDD$, such a SAR ADC can be implemented in accordance with this disclosure by reducing the capacitance of capacitors $C_N, C_{N-1}, \ldots, C_{N-Q}$ as they would be in a known SAR ADC configuration by N such that modified capacitors $\{C_{XN}, C_{XN-1}, \ldots, C_{XN-Q}\} = \{N*C_N, N*C_{N-1}, \ldots N*C_{N-Q}\}$, and the reduced amount of capacitance is added back through $C_{RED}=(1-N)\{C_N, C_{N-1}, \ldots, C_{N-Q}\}$.

Thus, in the exemplary embodiment above for $V_{REF}=N*V_{DD}$, where N<1, (e.g. N=3/8, following the example discussed above in reference to FIG. 1 such that $V_{REF}=0.375V$ for VDD=0.9V, where maximum $V_{IN}=0.300V$), capacitor 444 $C_{RED}=(5/8)*C_U$, and capacitors 412, 414, 416, 418 take the values $\{3/8*C_U, C_U/2, C_U/4, C_U/4\}$, where $C_U$ is a unit capacitance.

To further increase accuracy, a sample and hold (S/H) technique can be employed to hold a value of node 430, whereby once a sampled voltage, e.g., of a high frequency signal, develops on capacitors supporting a $V_{IN}$ line, the $V_{IN}$ line can be disconnected by switch S6 442 (which in some embodiments may itself be a S/H circuit), such that the analog sampled voltage for conversion to a digital approximation remains applied to the SAR ADC, while the $V_{IN}$ signal continues to vary according to its frequency. This is particularly advantageous when switch $S_6$ is a MOSFET transistor exhibiting a drain-source capacitance in line with node 430.

FIG. 5 depicts an exemplary configuration of a successive approximation register (SAR) analog-to-digital converter (ADC) 500 in accordance with some embodiments. SAR ADC 500 includes sample-and-hold (S/H) circuit 510, comparator 520, SAR 530, and digital-to-analog converter (DAC) 540. S/H circuit 510 receives as input an analog input voltage ($V_{IN}$) which is to be digitized, samples and holds that voltage for a specified amount of time, and outputs the sampled and held voltage. Comparator 520 can have an output, a first input, and a second input, and can include, for example, an operational amplifier. Comparator 520 can be coupled to VSS on node 512 as a second input, and also can be coupled to node 542 which receives a DAC 540 generated analog signal. Thus, comparator 520 receives an internal analog voltage at the first input from node 542 that the comparator compares to VSS. SAR 530 (and optionally DAC 540) may be coupled to a source of an internal or external clock signal, e.g. clock 546, as well as to comparator 520 so as to receive the output of the comparator's comparison between VSS and the internal analog voltage, and also is coupled to a source of a clock signal, e.g. clock 546. Nothing in this exemplary configuration is intended to be limiting, and many configurations are possible. For example, an SAR ADC in accordance with the present invention may alternatively be an asynchronous implementation of an SAR ADC that does not require a clock. Also, while illustrated as comparing VSS to node 542 (as illustrated above with respect to FIG. 4, where node 420 is compared to VSS 426) alternatively a comparison may be made between other suitable voltage. For example, in other embodiments, (e.g. such as the embodiment shown in FIG. 7A) $V_{IN}$ is supplied on node 710 corresponding to node 542 and, e.g., during track mode, a voltage $V_{IN}$ may develop on the capacitors 741-746, such that during hold mode, a difference between VIN and binary weighted voltages based on VDD and $V_{REF}$ appear at the non-inverting input of comparator 720. As will be appreciated a specific configuration will be based on design choices associated with what a comparator 520, 720, or 720' is comparing a node 542, 721, or 721' with (e.g. what is coupled to the inverting terminal in the illustrated examples) and the desired polarity of the output logic of comparator 520, 720, or 720'. In other embodiments, e.g. such as the embodiments depicted in FIG. 8, the SAR ADC may be a fully differential implementation, in which differential voltages are compared, thus converging on each other to obtain an output approximation.

As depicted in FIG. 5, SAR 530 is coupled to comparator 520 and to DAC 540 and configured to receive the output of the comparator as input and to generate based thereon a parallel digital output, which can include an approximate n-bit digital word or code ($D_{N-1}$, $D_{N-2}$, ... $D_2$, $D_1$, $D_0$) representing $V_{IN}$, which can have a most significant bit (e.g., $D_{N-1}$) and a plurality of less significant bits (e.g., $D_{N-2}$, ... $D_2$, $D_1$, $D_0$) (some of which bits can be referred to as being more significant bits). Based on the parallel n-bit digital output, e.g., ($D_{N-1}$, $D_{N-2}$, ... $D_2$, $D_1$, $D_0$) and based the combination of voltages which it receives, DAC 540 generates the internal analog voltage that is provided to the first input of comparator 520. For example, DAC 540 converts the digital word or code received from SAR 530 into an analog signal for comparison by comparator 520. Control circuitry (not specifically illustrated), such as any suitable combination of hardware, e.g., a shift register block, control logic, and the like such as can be implemented using application specific integrated circuit (ASIC), field programmable gate array (FPGA), or the like, and/or software implemented by a data processing unit, can be coupled to each of S/H circuit 510, comparator 520, SAR 530, and/or DAC 540 and configured so as to perform operations such as described herein.

The SAR ADC 500 illustrated in FIG. 5 can be configured so as to apply a binary search algorithm as described above to determine the closest digital word or code to approximate a sampled voltage of input signal $V_{IN}$. For example, SAR 530 can be configured to perform a binary search to test each possible bit against a midpoint voltage as described above to arrive at an approximation of $V_{IN}$, wherein beginning with the most significant bit (MSB) each bit is tested by comparing, by comparator 520, the internal analog signal generated by DAC, based sample $V_{IN}$, as it appears at node 542 (i.e. the difference between the magnitude of a voltage appearing at 544 and the output of DAC 540 on node 546, against an appropriate voltage based on the logic chosen; as depicted in FIG. 5, the comparator compares node 542 to VSS on node 512. And based upon comparator 520 sensing that the internal analog signal exceeds the VSS, comparator 520 asserts a signal causing SAR 530 to either assert or de-assert the tested bit depending on the logic employed in SAR 530.

For example, in some embodiments, during operation, exemplary SAR logic (not specifically illustrated) coupled to SAR 530 can initialize the SAR so that the MSB is equal to 1. If the internal analog voltage generated by DAC 540 and VIN, through illustrative summer 548 operation, and appearing at node 542 exceeds $V_{SS}$, the output of comparator 520 causes SAR 530 to reset the bit, otherwise the bit is left a 1. Then the next bit is set to 1, and the test is performed again. This continues through all the bits, thereby performing a binary search until each bit in the SAR is tested. The final resulting bit sequence is a digital approximation of the sampled input signal, which sequence is then output by the SAR 530 at the end of conversion (EOC) on n-bit output 560. As described above with respect to FIG. 4, MSB $D_{N-1}$, and one or more more-significant bits, may be driven by $V_{DD}$, whereas less significant bits are driven by Vref. Thus, node 542 may be selectively coupled through a $C_{RED}$ to VDD and MSBs' and one or more significant bits' associated capacitors have a modified size to account for being driven by VDD as described with respect to FIG. 4 above.

Figure 6:
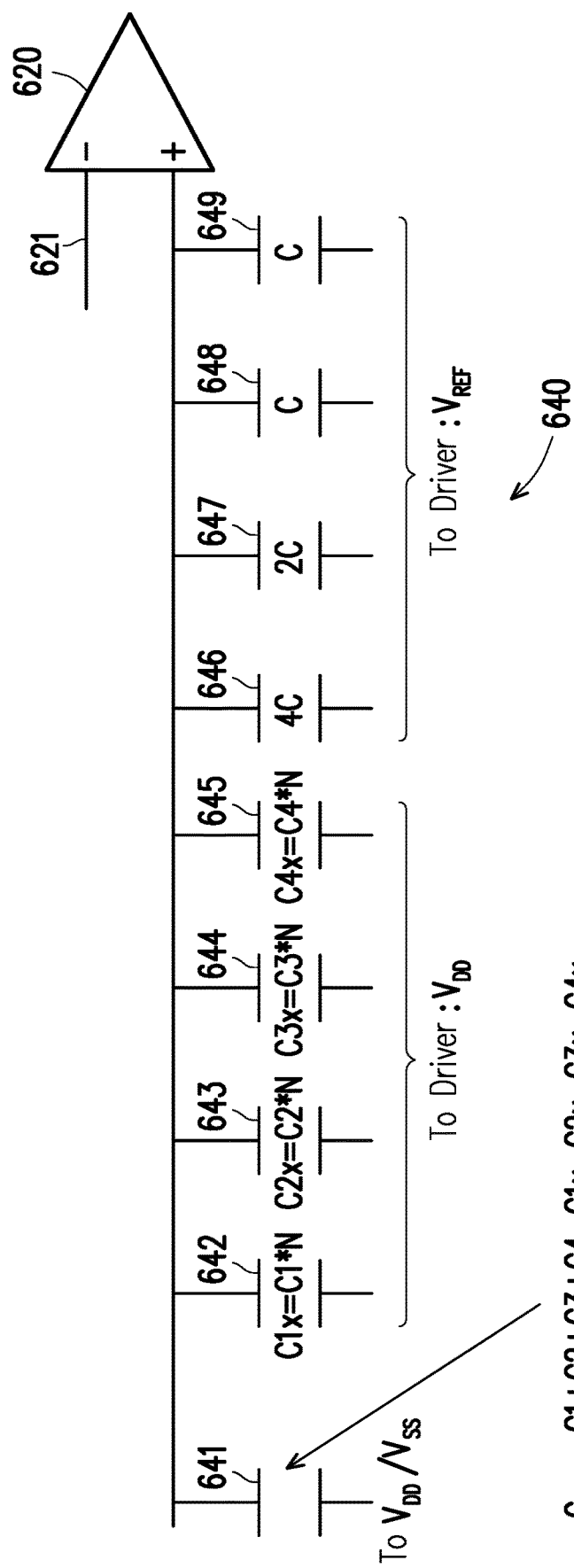
FIG. 6 depicts example diagrams of circuit components of an SAR ADC in accordance with some embodiments.

Various configurations of aspects of an SAR ADC in accordance with the present disclosure are described in greater detail below with reference to FIGS. 6, 7A-7B, and 8. In nonlimiting examples such as described below with reference to FIGS. 6, and 7A-7B, an approximation of $V_{IN}$ can be generated For example, FIG. 6 depicts an example diagram of some components of a circuit 640 forming a portion of a general case SAR ADC in accordance with some embodiments. FIG. 6 is not intended to illustrate an entire DAC, rather it is intended to illustrate how a capacitor bank (e.g. $C_{RED}$ 641, more significant bit capacitors 642-645, and less significant bit capacitors 646-649) according to various embodiments differ from known SAR ADCs. Whereas in known SAR ADCs each capacitor is selectably driven by a $V_{REF}$ signal, in various embodiments illustrated in FIG. 6, more significant bits, i.e. 642-645 are selectably driven by $V_{DD}$, while less significant bits are selectably driven by $V_{REF}$. Also, while comparator 620 is illustrated with node 621 coupled to the inverting terminal this is not intended to be limiting; as one of skill in the art will appreciate, the comparator inputs may be configured as desired based on overall circuit design or designer preference (e.g. whether an SAR, e.g. 530, expects a high or a low bit when 542 is greater than or less than 512). Capacitor bank in FIG. 6 may correspond to a similar DAC capacitor bank as shown in FIG. 5, where comparator 620 corresponds to comparator 520, and capacitors 641-649 are aspects of DAC 540. Whereas in the embodiment illustrated in FIG. 5, comparator 520 compares the internal analog signal on node 542 to VSS, in other embodiments, a comparison is made between the internal analog signal and $V_{IN}$, or another suitable voltage based on design choices. Thus, node 621 may correspond to node 512.

Comparator 620 can be configured similarly as described above with reference to FIG. 4. The capacitor components of circuit 640 can correspond to components residing in DAC 540 described above with reference to FIG. 5, and can include first capacitor 641 ($C_{RED}$) associated with the added back capacitances from capacitors C1x–C4x (642, 643, 644, 645) and connected to a supply voltage $V_{DD}$ or $V_{SS}$; second, third, fourth, and fifth capacitors 642, 643, 644, and 645 associated with more significant bits and each selectably coupled to supply voltage $V_{DD}$; and sixth, seventh, eighth, and ninth capacitors 646, 647, 648, and 649 associated with less significant bits and each selectably coupled to reference voltage $V_{REF}$. In the example shown, "C" denotes unit capacitance. In one nonlimiting example, $V_{REF}=V_{DD}*N$, where N is equal to ⅜ or other suitable fraction less than one where an input voltage is 600 mV peak-to-peak and a supply voltage is 900 mV. $V_{REF}$ is determined by the signal that is being sampled, such that $V_{REF}$ is about the maximum expected voltage of a varying input signal $V_{IN}$.

In the nonlimiting, exemplary embodiment illustrated in FIG. 6, first capacitor 641 can have a capacitance of $C_{RED}$=C1+C2+C3+C4−C1x−C2x−C3x−C4x, where C1=64C, C2=32C, C3=16C, and C4=8C, and where C is a unit capacitance; second capacitor 642 can have a capacitance of C1x=C1*N; third capacitor 643 can have a capacitance of C2x=C2*N; fourth capacitor 344 can have a capacitance of C3x=C3*N; fifth capacitor 645 can have a capacitance of C4x=C4*N; sixth capacitor 646 can have a capacitance of 4C; seventh capacitor 647 can have a capacitance of 2C; eighth capacitor 648 can have a capacitance of C; and ninth capacitor 649 can have a capacitance of C.

Other exemplary voltages and capacitances and numbers of capacitors suitably can be used.

In the exemplary circuit components illustrated in FIG. 6, the capacitors associated with the more significant bits (e.g., second, third, fourth, and fifth capacitors 642, 643, 644, 645) respectively are driven by the supply voltage $V_{DD}$ rather than by $V_{REF}$. Because these capacitors can be driven by more current than the capacitors associated with the less significant bits (e.g., sixth, seventh, eighth, and ninth capacitors 646, 647, 648, 649), connecting the capacitors associated with the more significant bits can make the $V_{REF}$ supply source design easier and/or can make the speed for the more significant bits faster, because $V_{REF}$ supply need not be designed to provide sufficient current to drive the larger capacitors 642, 643, 644, 645. Additionally, or alternatively, the decoupling capacitor for the $V_{REF}$ supply (not illustrated) can be made smaller, due to the driving current being significantly smaller thereby simplifying the design of an external $V_{REF}$ supply and reducing its footprint. The same total capacitance as in standard successive approximation techniques can be maintained by adding back the reduced capacitances, e.g., to $C_{RED}$, so as to make the equation correct. Table 1 below compares the speed, area of R, and minimum capacitance of the decoupling capacitor for the $V_{REF}$ supply, based on a nonlimiting, exemplary 8 bit/500 fF unit capacitance ADC design, for some embodiments of the present methods and devices as compared to use of a resistive divider to increase $V_{REF}$.

TABLE 1

|  | Present methods and devices | Resistive divider |
| --- | --- | --- |
| Speed | >5X | 1X |
| Area of R | 1X | >4X |
| Decoupling capacitor | 1X | >25X |

As noted above with reference to FIG. 5, S/H circuit 510 optionally can be used at the input of $V_{IN}$, e.g., so that fluctuations in $V_{IN}$ do not impact the A-C conversion through gate to source of a gate capacitor coupling $V_{IN}$ to the SAR ADC circuit as described above. In one exemplary configuration, S/H circuit 510 can include any previously known S/H circuit. In another exemplary configuration, S/H circuit 510 can include a S/H circuit such as described in co-pending U.S. patent application Ser. No. 16/135,053, filed on Sep. 19, 2018, and entitled "Low Distortion Sample and Hold (S/H) Circuits and Associated Methods for Use with Analog-to-Digital Converters (ADCs)" or U.S. Provisional Patent Application No. 62/564,353, filed Sep. 28, 2017 and entitled "Low Distortion Sample and Hold," the entire contents of both of which are incorporated by reference herein.

In FIG. 7A, a DAC-comparator configuration 740 that develops voltage $V_{DD}$ on the more significant bit capacitor network and $V_{REF}$ on the less significant bit capacitor network, and compares the voltage at node 721 via comparator 720 can be configured based on the techniques described above with reference to FIG. 5, and can receive as input via line 721 $V_{IN}$ from switch 710, which may be S/H circuit 510, a separate switch in series between a S/H circuit and node 720 in a similar manner as switch 402 described above with reference to FIG. 4. Aspects of DAC-comparator configuration 740 can correspond to components of DAC 540 described above with reference to FIG. 5 but are not intended to be limited. DAC-comparator components can include first capacitor 741 associated with the add back capacitance and switchably connected to a line carrying supply voltage $V_{DD}$ or $V_{SS}$ or other voltage $V_X$ (which may in embodiments be any suitable voltage based on design considerations) via a switch 781 (only one such switch labeled in FIG. 7A); second and third capacitors 742, 743 associated with an MSB and a more significant bit and each is switchably coupled to a line carrying supply voltage $V_{DD}$ or a line carrying $V_{SS}$ via respective switches 781; and fourth, fifth, and sixth capacitors 744, 745, 746 associated with less significant bits and each switchably coupled to a line carrying reference voltage $V_{REF}$ or to a line carrying supply voltage $V_{DD}$ via respective switches 781. In one nonlimiting example, $V_{REF}=V_{DD}*N$, where N is a constant ratio of $V_{REF}$ to VDD, such as a suitable fraction less than one and dictated by the voltages of the expected sampled signal.

In the nonlimiting, exemplary embodiment illustrated in FIG. 7A, first capacitor 741 can have a capacitance of $C'_{RED}=(1-N)*(C_N+ \ldots +C_{N-Q})$; second capacitor 742 can have a capacitance of $C'_N=N*C_N$, where in one example $C_N=32C$, where C is a unit capacitance; third capacitor 743 can have a capacitance of $C'_{N-Q}=N*C_{N-Q}$, where in one example $C_{N-Q}=8C$; fourth capacitor 744 can have a capacitance of $C_{N-Q-1}$, where in one example $C_{N-Q-1}=4C$; fifth capacitor 745 can have a capacitance of $C_1$, where in one example $C_1=C$; and sixth capacitor 746 can have a capacitance of $C_0$, where in one example $C_0=C$. Other exemplary voltages and capacitances and numbers of capacitors suitably can be used. Additionally, it should be appreciated that one or more of the capacitors designated as associated with more significant bits instead can be designated as associated with a less significant bit, and that one or more of the capacitors designated as associated with less significant bits instead can be designated as associated with a more significant bit.

In FIG. 7B, an alternative DAC-comparator configuration is illustrated that develops voltage $V_{IN}$ across a capacitor network, and compares the voltage at node 721' to another voltage as desired based on design considerations. The embodiments in so far as the polarity of voltages is switched when in hold mode, otherwise it will be appreciated that the principles of operation of both are similar. Comparator 720' can be configured similarly as comparator 520 described above with reference to FIG. 5, and can receive as input via line 721' from circuit 710' which can correspond to circuit 510 described above with reference to FIG. 5. While the configuration is the same, as will be appreciated, depending on what node 721' is being compared with by comparator 720' the output logic and other control logic may differ between the embodiments depicted in FIGS. 7A and 7B. DAC-comparator capacitor components 740' and switches 781' may in embodiments correspond to components of DAC 540 described above with reference to FIG. 5, and can include first capacitor 741' associated with the add back capacitance and switchably connected either to a line carrying supply voltage $V_{DD}$ or $V_{SS}$ or other voltage $V_X$ or to a line carrying $V_{IN}$ via a switch 781' (only one such switch labeled in FIG. 7B); second and third capacitors 742', 743' associated with more significant bits and each switchably coupled to a line carrying supply voltage $V_{DD}$ or to the line carrying $V_{IN}$ via respective switches 781'; and fourth, fifth, and sixth capacitors 744, 745, 746 associated with less significant bits and each switchably coupled to a line carrying reference voltage $V_{REF}$ or to the line carrying $V_{IN}$ via respective switches 681'. In one nonlimiting example, $V_{REF}=V_{DD}*N$, where N is a constant, such as a suitable fraction less than one dictated by the expected sample signal magnitude.

In the nonlimiting, exemplary embodiment illustrated in FIG. 7B, first, second, third, fourth, fifth, and sixth capacitors 741', 742', 743', 744', 745', 746' respectively can have similar capacitances as described above for first, second, third, fourth, fifth, and sixth capacitors 741, 742, 743, 744, 745, 746 described above with reference to FIG. 7A. Other exemplary voltages and capacitances and numbers of capacitors suitably can be used. Additionally, it should be appreciated that one or more of the capacitors designated as associated with more significant bits instead can be designated as associated with a less significant bit, and that one or more of the capacitors designated as associated with less significant bits instead can be designated as associated with a more significant bit.

As another nonlimiting example, FIG. 8 depicts an example diagram of circuit components of a differential SAR ADC in accordance with some embodiments. In FIG. 8, comparator 820 can be configured similarly as comparator 520 described above with reference to FIG. 5, and can receive as input $V_{INN}$ via line 821 (referred to in FIGS. 8 and 9 as SH_OUT_N) from switch 810 which can be any suitable switch, in some embodiments it may be a sample and hold to circuit like circuit 510 described above with reference to FIG. 5. In accordance with FIG. 8 embodiments, FIG. 5 would include a coupled second SAR/DAC output through a capacitor network to the inverting terminal, and VIN to such a network would instead include a complimentary VIN-bar at node 722. Comparator 820 illustrated in FIG. 8 thus can receive as input $V_{INP}$ via line 722 a complementary signal to $V_{INN}$ (referred to in FIGS. 8 and 9 as SH_OUT_P) from switch 811 which can be any suitable switch, in some embodiments it may be a sample and hold circuit like 510 described above with reference to FIG. 5. It will be appreciated from this disclosure that the SAR ADC implemented with DACs 840 and 840' use two SAR components controlling the switched capacitor of each DAC 840 and 840'.

DAC components 840 and 840' can correspond to components similar to components of DAC 540 according to the techniques described above with reference to FIG. 5, and can include first capacitor 841 or 841', respectively, associated with the add back capacitances and switchably connected to lines carrying supply voltage $V_{DD}$ or $V_{SS}$ or other voltage $V_X$ via a switches 881 (only one such switch labeled in FIG. 8); second and third capacitors 842, 842', 843, 843' associated with more significant bits and each switchably coupled to a line carrying supply voltage $V_{DD}$ or a line carrying $V_{SS}$ via respective switches 881; and fourth, fifth, and sixth capacitors 844, 844', 845, 845', 846, 846' associated with less significant bits and each switchably coupled to a line carrying reference voltage $V_{REF}$ or to a line carrying supply voltage $V_{SS}$ via respective switches 881. In one nonlimiting example, $V_{REF}=V_{DD}*N$, where N is a constant, such as a suitable fraction less than one as dictated by the maximum magnitude expected of $V_{INP}$ and $V_{INN}$. Again, as one will appreciate, an SAR ADC reference voltage is optimally selected in accordance with the maximum voltage of the sampled input $V_{INN}$ signal.

In the nonlimiting, exemplary embodiment illustrated in FIG. 8, first, second, third, fourth, fifth, and sixth capacitors 841, 841', 842, 842', 843, 843', 844, 844', 845, 845', 846, 846' respectively can have similar capacitances as described above for first, second, third, fourth, fifth, and sixth capacitors 641, 642, 643, 644, 645, 646 described above with reference to FIG. 7A. Other exemplary voltages and capacitances and numbers of capacitors suitably can be used. Additionally, it should be appreciated that one or more of the capacitors designated as associated with more significant bits instead can be designated as associated with a less significant bit, and that one or more of the capacitors designated as associated with less significant bits instead can be designated as associated with a more significant bit.

Figure 9A:
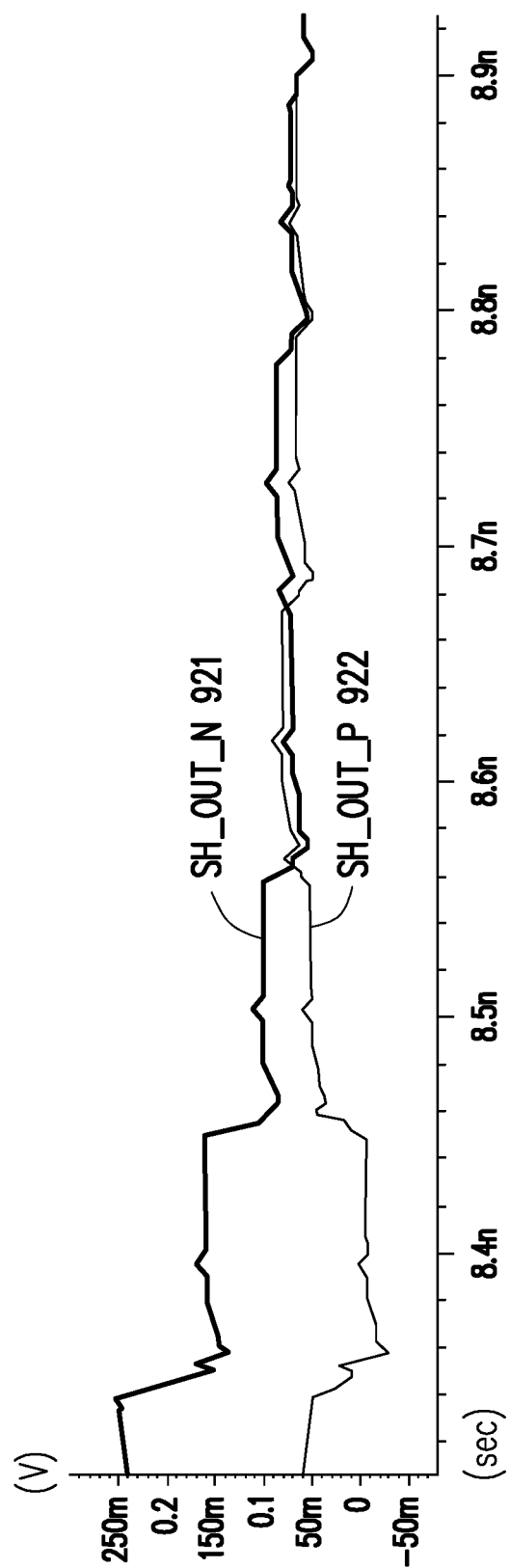
FIG. 9A depicts an example diagram of a plot of signal levels during use of the exemplary SAR ADC of FIG. 8, in accordance with some embodiments.
Figure 9B:
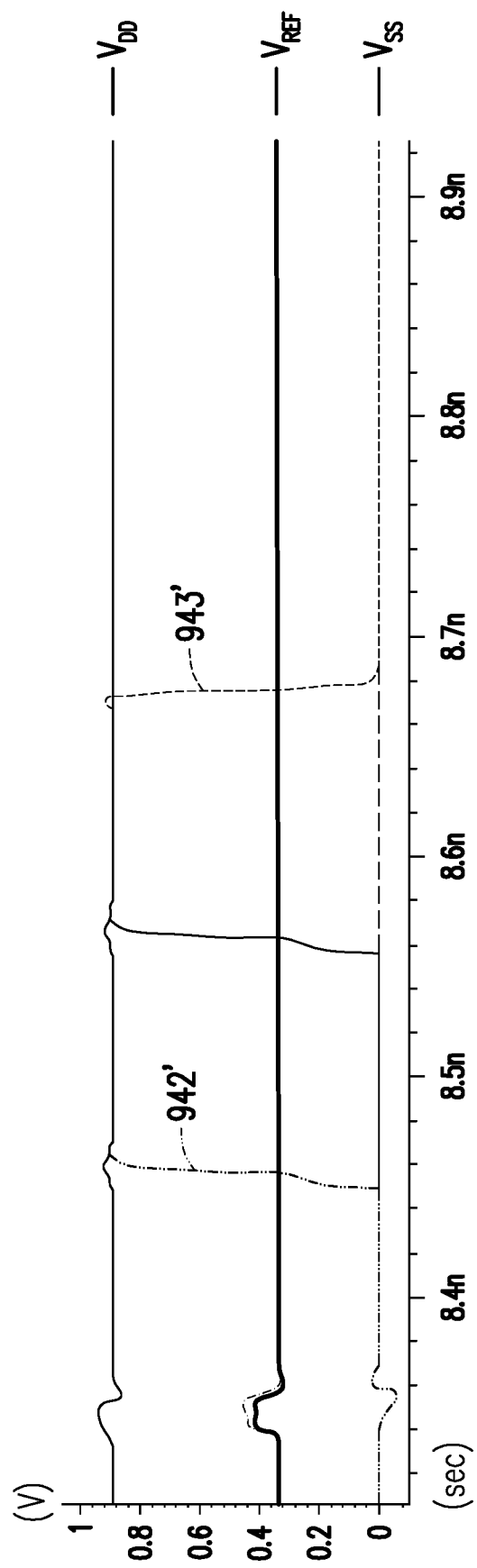
FIG. 9B depicts an example diagram of a plot of signal levels during use of the exemplary SAR ADC of FIG. 8, in accordance with some embodiments.
Figure 9C:
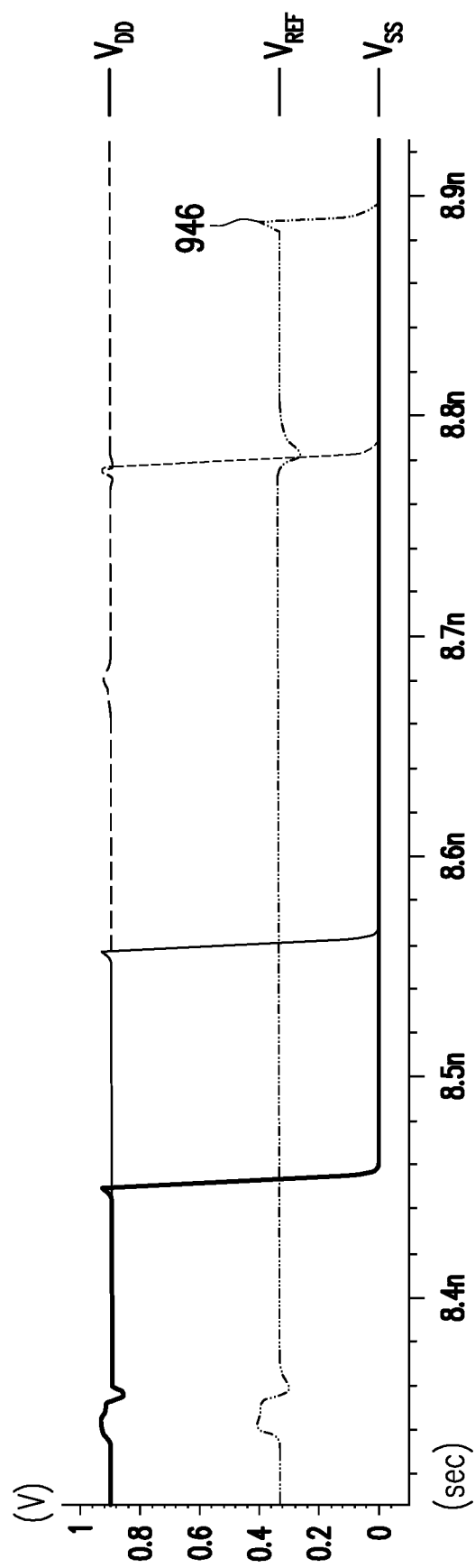
FIG. 9C depicts an example diagram of a plot of signal levels during use of the exemplary SAR ADC of FIG. 8, in accordance with some embodiments.

FIGS. 9A-9C depict example diagrams of plots of signal levels during use of the exemplary SAR ADC of FIG. 8, in accordance with some embodiments. Exemplary signal levels for SH_OUT_N 921 corresponding to a voltage on node 821, SH_OUT_P 922 corresponding to node 822 are shown in the plot illustrated in FIG. 9A. FIGS. 9B and 9C illustrated $V_{DD}$ levels and $V_{REF}$ levels, and $V_{SS}$ in order to illustrate the adding and removing of binary weighted voltages associated with more significant bits (e.g. 942' and 943') as they are coupled to or decoupled from VDD. It should be appreciated that such signal levels are purely illustrative, and should not be construed as limiting. In the plot in FIG. 9A, SH_OUT_N 921 and SH_OUT_P 922 are illustrated converging on a same voltage as the SAR ADC conducts a binary search of values to determine a digital differential voltage value approximating the differential analog voltage between $V_{INN}$ and $V_{INP}$. In the plot in FIG. 9B, values corresponding to individual bit switch capacitors are shown as the SAR performs its binary search. As shown for example voltage 942' corresponding to MSB 842' and a more significant bit voltage 943' are switched between VSS and VDD, where as a less significant bit voltage value 946 shown in FIG. 9C is switched between VSS and $V_{REF}$, e.g. as in FIG. 8, less significant bit 846 is driven by $V_{REF}$. In the example shown every approximately $\frac{1}{10}^{th}$ of a nanosecond a bit is tested as bit switches are switched thereby adding or removing charge from, e.g. nodes 821 or 822 causing SH_OUT_N 921 and SH_OUT_P 922 to converge on a same voltage, shown in FIG. 9A, corresponding to the differential voltage value between the sampled signals on $V_{INN}$ and $V_{INP}$.

Figure 10:
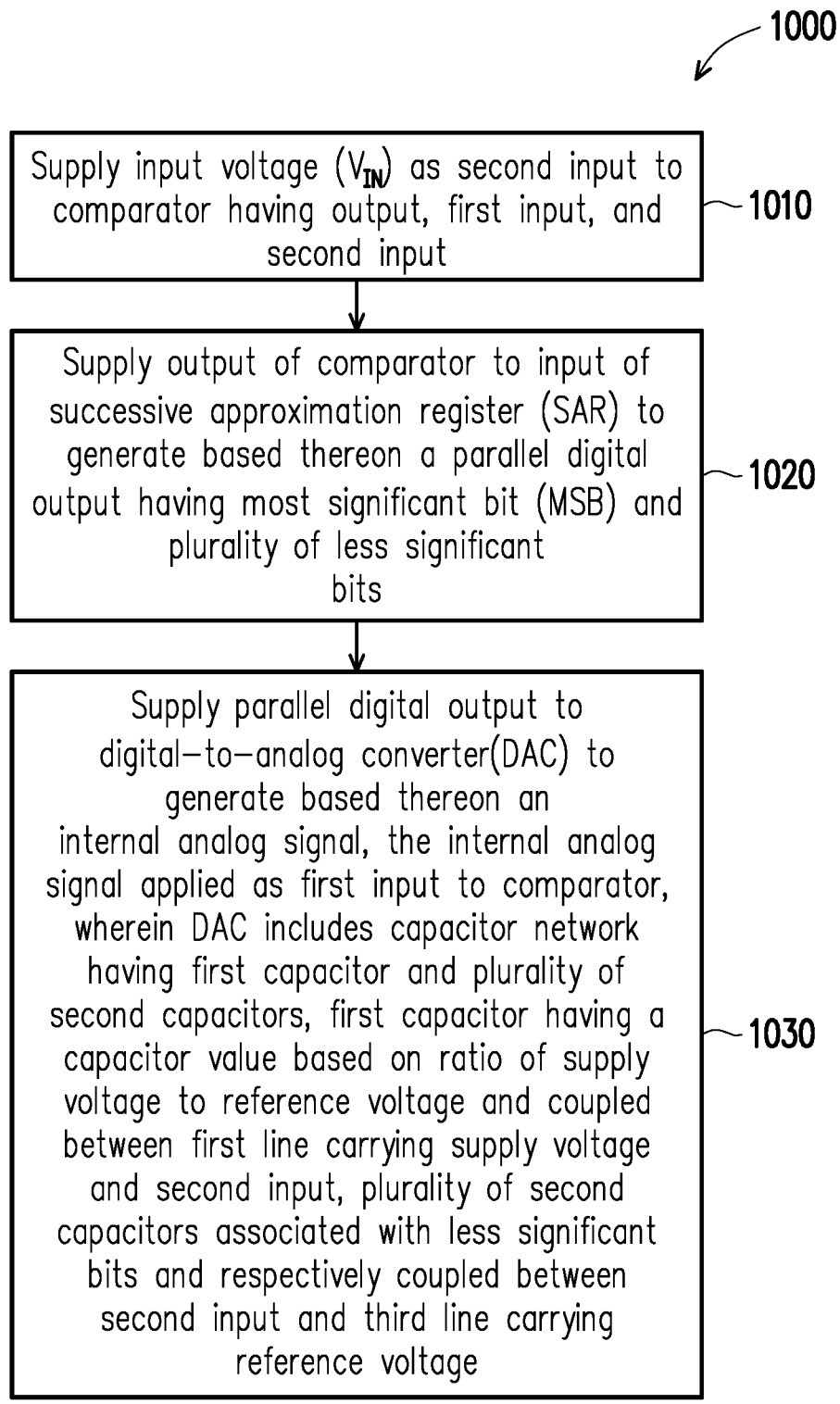
FIG. 10 depicts an example flow chart for performing analog to digital conversion using an SAR ADC in accordance with some embodiments.

FIG. 10 depicts an example flow chart for performing analog-to-digital conversion using an SAR ADC in accordance with some embodiments. Method 1000 illustrated in FIG. 10 includes an operation of supplying an input voltage ($V_{IN}$) as a second input to a comparator having an output, a first input, and the second input (1010). For example, comparator 520 illustrated in FIG. 5 can receive $V_{IN}$ at its second input. Method 1000 illustrated in FIG. 10 also can include an operation of supplying the output of the comparator to an input of a successive approximation register (SAR) to generate based thereon a parallel digital output having an MSB and a plurality of less significant bits (1020). For example, the output of comparator 520 illustrated in FIG. 5 can be coupled to SAR 530, which generates based thereon a parallel digital output having an MSB and a plurality of less significant bits. Method 1000 illustrated in FIG. 10 also can include supplying the parallel digital output to a DAC to generate based thereon an internal analog signal, the internal analog signal applied as the first input to the comparator (1030). As described above with reference to FIGS. 4, 5, 6, 7A-7B, and 8, a DAC (e.g., DAC 540 illustrated in FIG. 5) includes a capacitor network having a first capacitor associated with the add back capacitance and a plurality of second capacitors. The first capacitor can be coupled between a first line carrying a first voltage and a second line carrying a second voltage. The plurality of second capacitors can be associated with more significant bits, and are associated with capacitors having reduced capacitance, and are coupled between the first voltage and the second voltage. The less significant bits are associated with capacitors having standard capacitance for an SAR ADC, and respectively coupled between the first line and a third line carrying a third voltage.

Accordingly, the present methods and devices provide ADCs, DACs, and associated circuitry that can use suitable voltages to drive respective capacitors within capacitor networks, which provides for improved speed, simplified reference voltage supply design, smaller decoupling capacitors for the reference voltage supply, while maintaining a similar total capacitance.

In one embodiment, an analog-to-digital converter (ADC) device comprises a comparator having an output, a first input, and a second input. And the ADC includes a successive approximation register (SAR) configured to receive the output of the comparator as an input and to generate based thereon a parallel digital output having a most significant bit (MSB) and a plurality of less significant bits associated with a reference voltage. The ADC also includes a digital-to-analog converter (DAC) configured to receive the parallel digital output from the SAR and to generate based thereon an internal analog signal, the internal analog signal applied as the first input to the comparator. The DAC further includes a capacitor network coupled to the first input having a redistribution capacitor coupled to a first voltage that is greater than the reference voltage such that a ratio N is equal to the reference voltage divided by the first voltage. The DAC also includes one or more first capacitors also coupled to the first voltage, where at least one first capacitor is associated with the MSB. The DAC further including and a plurality of second capacitors coupled to the reference voltage, wherein the redistribution capacitor having a capacitive value that is equal to (1−N) times the total capacitance of a parallel combination of the one or more first capacitors. And the second capacitors are associated with less significant bits, and an input voltage line carrying an input voltage ($V_{IN}$) switchably coupled to the first input or switchably coupled to the second input.

In another embodiment, a method for performing an analog-to-digital conversion includes supplying an input voltage ($V_{IN}$) as a second input to a comparator having an output, a first input, and the second input. And supplying the output of the comparator as an input of a successive approximation register (SAR) to generate based thereon a parallel digital output having a plurality of more significant bits, including a most significant bit (MSB), and a plurality of less significant bits. And supplying the parallel digital output to a digital-to-analog converter (DAC) to generate based thereon an internal analog signal, the internal analog signal applied as the first input to the comparator, wherein the internal analog signal is generated by voltage division across a plurality of capacitors. The DAC includes a first capacitor network having a first capacitor and a second capacitor network having plurality of second capacitors, and a third capacitor network having a plurality of third capacitors, the first capacitor having a value based the total parallel capacitance of each of the second capacitors and coupled between a first line carrying a first voltage and a second line carrying a second voltage, the plurality of second capacitors associated with the plurality of more significant bits, including the MSB, further wherein the plurality of second capacitors each also coupled between the first line and the second line and having respectively a value based on a ratio of the first voltage to a third voltage that is less than the first voltage, further wherein the plurality of third capacitors are associated with the less significant bits and respectively coupled between the first line and a third line carrying the third voltage.

In yet another embodiment, a DAC includes a capacitor network having a first capacitor and a plurality of second capacitors, the first capacitor being coupled to a first line carrying a first voltage and a second line carrying a second voltage, and the plurality of second capacitors being coupled to the second line and to a third line carrying a third voltage. The first voltage is greater than the third voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

This written description and the following claims may include terms, such as "on," that are used for descriptive purposes only and are not to be construed as limiting. The embodiments of an SAR, SAR ADC, DAC, S/H circuit, and/or related circuitry described herein can be manufactured, used, or shipped in a number of configurations.

What is claimed is:

1. An analog-to-digital converter (ADC) device comprising:
    a comparator having an output, a first input, and a second input;
    a successive approximation register (SAR) configured to receive the output of the comparator as an input and to generate based thereon a parallel digital output having a most significant bit (MSB) and a plurality of less significant bits associated with a reference voltage;
    a digital-to-analog converter (DAC) configured to receive the parallel digital output from the SAR and to generate based thereon an internal analog signal, the internal analog signal applied as the first input to the comparator,
    wherein the DAC includes a capacitor network coupled to the first input having:
        a redistribution capacitor coupled to a first voltage that is greater than the reference voltage such that a ratio N is equal to the reference voltage divided by the first voltage;
        one or more first capacitors also coupled to the first voltage at least one first capacitor associated with the MSB; and
        a plurality of second capacitors coupled to the reference voltage, wherein the redistribution capacitor having a capacitive value that is equal to (1−N) times the total capacitance of a parallel combination of the one or more first capacitors, further wherein the second capacitors are associated with less significant bits; and
    an input voltage line carrying an input voltage ($V_{IN}$) switchably coupled to the first input or switchably coupled to the second input.

2. The ADC of claim 1, wherein:
    the SAR is configured to perform a binary search to test each possible bit of the parallel digital output, wherein beginning with the MSB each bit is tested by comparing, by the comparator, the internal analog signal to the VIN signal, and based upon the comparator sensing that the internal analog signal exceeds the Vrn signal, the comparator asserts a signal causing the SAR to either de-assert the tested bit or to set the tested bit.

3. The ADC of claim 1, wherein based upon the MSB remaining high during testing, one or more of the first capacitors associated with one or more more-significant bits is tied to $V_{DD}$, wherein the MSB is one of the one or more significant bits.

4. The ADC of claim 1, wherein Vrn is sampled from a varying analog signal by a sample and hold circuit.

5. The ADC of claim 1, wherein the SAR implements a successive approximation algorithm.

6. The ADC of claim 1, wherein the one or more first capacitors is associated with one or more significant bits in addition to the MSB.

7. The ADC of claim 1, wherein at the SAR performs a binary search of values of the parallel digital output.

8. The ADC of claim 1, further comprising a plurality of switches respectively configured to decouple the first capacitor from VDD and to decouple the plurality of second capacitors from $V_{REF}$.

9. A method for performing an analog-to-digital conversion, the method comprising:
supplying an input voltage ($V_{IN}$) as a second input to a comparator having an output, a first input, and the second input;
supplying the output of the comparator to an input of a successive approximation register (SAR) to generate based thereon a parallel digital output having a plurality of more significant bits, including a most significant bit (MSB), and a plurality of less significant bits;
supplying the parallel digital output to a digital-to-analog converter (DAC) to generate based thereon an internal analog signal, the internal analog signal applied as the first input to the comparator, wherein the internal analog signal is generated by voltage division across a plurality of capacitors,
wherein the DAC includes a first capacitor network having a first capacitor and a second capacitor network having plurality of second capacitors, and a third capacitor network having a plurality of third capacitors, the first capacitor having a value based on the total parallel capacitance of each of the second capacitors and coupled between a first line carrying a first voltage and a second line carrying a second voltage, the plurality of second capacitors associated with the plurality of more significant bits, including the MSB, further wherein the plurality of second capacitors each switchable coupled between the first line and the second line and having respectively a value based on a ratio of the first voltage to a third voltage that is less than the first voltage, further wherein the plurality of third capacitors are associated with the less significant bits and respectively switchably coupled between the first line and a third line carrying the third voltage.

10. The method of claim 9, wherein:
the SAR performs a binary search to test each possible bit of the parallel digital output,
wherein beginning with the MSB each bit is tested by comparing, by the comparator, the internal analog signal to the $V_{IN}$ signal; and
based upon the comparator sensing that the internal analog signal exceeds the $V_{IN}$ signal, the comparator asserts a signal causing the SAR to either de-assert the tested bit or set the tested bit.

11. The method of claim 9, wherein when none of the more significant bits remains high during testing, the redistribution capacitor is switchably decoupled from the first line.

12. The method of claim 9, wherein the first voltage is $V_{DD}$.

13. The method of claim 12, wherein the first voltage is $V_{SS}$.

14. The method of claim 13, wherein the third voltage is a reference voltage $V_{REF}$.

15. The method of claim 9, wherein based upon the MSB being set high and the less significant bits being set low, the internal analog signal is equal to $V_{REF}/2$.

16. The method of claim 9, further comprising providing a plurality of switches respectively configured to switchably couple the first capacitor to the first line and to switchably couple the plurality of third capacitors from the third voltage line.

17. A digital-to-analog converter (DAC), comprising:
a capacitor network having a first capacitor and a plurality of second capacitors,
the first capacitor being coupled to a first line carrying a first voltage and a second line carrying a second voltage, and
the plurality of second capacitors being coupled to the second line and to a first node switchably coupled by a first switch to a third line carrying a third voltage, and
wherein the third voltage is a reference voltage, and the first capacitor is not connected or switchably adapted to connect to the third line, and
wherein the first voltage is greater than the third voltage and a successive approximation register (SAR) output controls the first switch.

18. The DAC of claim 17, wherein the first voltage is a supply voltage $V_{DD}$.

19. The DAC of claim 17, further comprising a plurality of switches respectively configured to switchably couple the first capacitor to the first voltage when one or more capacitors associated with more significant bits are also switchably coupled to the first voltage, wherein the plurality of switches are controlled by signals from the SAR.

20. The DAC of claim 17, wherein the SAR performs a successive approximation algorithm.

* * * * *